United States Patent
Kjeldsen et al.

(10) Patent No.: US 8,682,013 B2
(45) Date of Patent: Mar. 25, 2014

(54) HEARING DEVICE WITH AUTOMATIC CLIPPING PREVENTION AND CORRESPONDING METHOD

(75) Inventors: Christian Park Kjeldsen, Vanløse (DK); Jørn Skovgaard, Smørum (DK)

(73) Assignee: Oticon A/S, Smorum (DK)

( * ) Notice: Subject to any disclaimer, the term of this patent is extended or adjusted under 35 U.S.C. 154(b) by 154 days.

(21) Appl. No.: 13/439,612

(22) Filed: Apr. 4, 2012

(65) Prior Publication Data

US 2012/0263329 A1 Oct. 18, 2012

Related U.S. Application Data

(60) Provisional application No. 61/474,767, filed on Apr. 13, 2011.

(30) Foreign Application Priority Data

Apr. 13, 2011 (EP) .................................... 11162249

(51) Int. Cl.
*H04R 25/00* (2006.01)
(52) U.S. Cl.
USPC ............................ 381/315; 381/314; 381/321
(58) Field of Classification Search
USPC .................................. 381/312, 314, 315, 321
See application file for complete search history.

(56) References Cited

U.S. PATENT DOCUMENTS

| | | | |
|---|---|---|---|
| 4,531,229 A | 7/1985 | Coulter | |
| 4,718,099 A * | 1/1988 | Hotvet | 381/317 |
| 5,903,655 A | 5/1999 | Salmi et al. | |
| 6,198,830 B1 | 3/2001 | Holube et al. | |
| 6,628,795 B1 | 9/2003 | Ludvigsen | |
| 6,862,359 B2 | 3/2005 | Nordqvist et al. | |
| 8,488,811 B2 * | 7/2013 | Smithers et al. | 381/107 |
| 2003/0012391 A1 | 1/2003 | Armstrong et al. | |
| 2008/0218395 A1 | 9/2008 | Tomioka et al. | |
| 2010/0040244 A1 | 2/2010 | Smith et al. | |
| 2011/0013794 A1 | 1/2011 | Hau et al. | |

* cited by examiner

*Primary Examiner* — Brian Ensey
*Assistant Examiner* — Katherine Faley
(74) *Attorney, Agent, or Firm* — Birch, Stewart, Kolasch & Birch, LLP

(57) ABSTRACT

In digital hearing devices, it is common to reduce the preamplifier gain when very loud signals are received in order to avoid clipping. It is known to temporarily reduce the preamplifier gain with fast attack and release times when a clipping of the input signal in the digitizer is expected. Perceived signal quality of the audible signal provided to the user of the hearing device is herein improved by simultaneously providing relatively fast and relatively slow temporary reductions of the amplifier gain such that the slow gain reductions reduce the occurrences of fast gain reductions. This allows the hearing device to provide a high quality sound to the user where clipping is reduced due to the fast gain reductions and where signal artifacts, such as pumping and switching noise, produced by the fast gain reductions is reduced due to the slow gain reductions.

15 Claims, 3 Drawing Sheets

HEARING DEVICE WITH AUTOMATIC CLIPPING PREVENTION AND CORRESPONDING METHOD

CROSS REFERENCE TO RELATED APPLICATIONS

This nonprovisional application claims the benefit of U.S. Provisional Application No. 61/474,767 filed on Apr. 13, 2011 and to Patent Application No. 11162249.4 filed in Europe, on Apr. 13, 2011. The entire contents of all of the above applications is hereby incorporated by reference.

TECHNICAL FIELD

The present invention relates to a hearing device with automatic gain control preceding a digitiser.

The invention may e.g. be useful in applications such as hearing aids for compensating a hearing-impaired person's loss of hearing capability or listening devices for augmenting a normal-hearing person's hearing capability.

BACKGROUND ART

Digital hearing devices are known in the art. Such a device typically comprises a microphone, a preamplifier, an analog-to-digital converter (ADC), a signal processor, a digital-to-analog converter (DAC) and a speaker connected to form an audio signal path. A known problem with such hearing devices is that the dynamic range of the ADC is typically chosen less than the dynamic range of acoustic signals generally encountered in order to reduce the power consumption of the ADC. This reduction is especially important in hearing devices, such as hearing aids, intended for being worn at or in an individual's ear where the space for batteries is generally limited.

It is further known to increase the dynamic range of the hearing aid without increasing the power consumption of the hearing device by varying the gain of the preamplifier depending on the level of the microphone signal. Since clipping substantially increases distortion of the digitised signal, the gain is reduced when loud signals are received and vice versa. Thus the hearing device may reproduce e.g. speech signals with high quality both when the speaking person is close-by and when he or she is further away from the wearer.

Technical progress has led to ADC's which have low power consumption and at the same time have dynamic ranges nearly large enough to comprise the dynamic range of typical acoustic signals. A reduction of the preamplifier gain thus need only be applied when very loud signals are received, and it is therefore a known solution to temporarily reduce the preamplifier gain with fast attack and release times when a clipping of the amplified signal during digitising is expected.

The above approaches do, however, not provide a completely satisfactory signal quality. On one hand, the attack time needs to be short enough to prevent clipping in the event of transients, e.g. noise produced by hand-clapping or cutlery hitting a plate, and the release time should not be too long in order to allow the individual to hear speech and other sounds following such a transient. On the other hand, if too short attack and release times are chosen, the gain changes themselves produce audible distortion of the digitised signal. Furthermore, if a long release time is chosen in order to reduce the latter distortion, the gain changes may instead cause so-called "pumping", i.e. a noticeable and annoying level variation following the transient. The pumping will be increased if the hearing device applies dynamic range compression, which is typically the case in hearing aids in order to compensate for recruitment.

It is an object of the present invention to provide a hearing device without the above disadvantages.

It is a further object to provide a method for operating a hearing device which allows the hearing device to operate without the above disadvantages.

DISCLOSURE OF INVENTION

These and other objects of the invention are achieved by the invention defined in the independent claims and as explained in the following description. Further objects of the invention are achieved by the embodiments defined in the dependent claims and in the detailed description of the invention.

Simultaneously providing relatively fast and relatively slow temporary reductions of the amplifier gain allows the hearing device to provide a high quality sound to the individual where clipping is reduced due to the fast gain reductions and signal artefacts produced by fast gain reductions is reduced due to the slow gain reductions.

In the present context, a "hearing device" refers to a device, such as e.g. a hearing aid or an active ear-protection device, which is adapted to improve or augment the hearing capability of an individual by receiving acoustic signals from the individuals' surroundings, modifying the acoustic signals electronically and providing audible signals to at least one of the individual's ears. An "audible signal" means any signal that an individual may perceive as a sound. Such audible signals may e.g. be provided in the form of acoustic signals radiated into the individual's outer ears, acoustic signals transferred as mechanical vibrations to the individual's inner ears via the bone structure of the individual's head and/or electric signals transferred to the cochlear nerve of the individual. The hearing device may be configured to be worn in any known way, e.g. as a unit arranged behind the ear with a tube leading radiated acoustic signals into the ear canal or with a speaker arranged close to or in the ear canal, as a unit entirely or partly arranged in the pinna and/or in the ear canal, as a unit attached to a fixture implanted into the skull bone, etc.

A "hearing system" refers to a system comprising one or two hearing devices, and a "binaural hearing system" refers to a system comprising one or two hearing devices and being adapted to provide audible signals to both of the individual's ears. Both hearing systems and binaural hearing systems may comprise "auxiliary devices", which communicate with the hearing devices and affect and/or benefit from the function of the hearing devices. Auxiliary devices may be e.g. remote controls, audio gateway devices, mobile phones, public-address systems, car audio systems or music players. Hearing devices, hearing systems and binaural hearing systems may e.g. be used in compensating for a hearing-impaired person's loss of hearing capability or augmenting a normal-hearing person's hearing capability.

Within this document, "attack time" means the time needed to effect a gain reduction and "release time" means the time needed to restore the gain to the value before the gain reduction. "Hold time" means the time between reaching the target gain reduction and initiating restoration of the gain. The "duration" of a gain reduction equals the sum of the attack time, the hold time and the release time. Quantified attack and release times mentioned herein are to be construed as the time period from a gain change is initiated until the gain is within 2 dB of the target gain. Attack, hold and release times are referred to in common as "time constants".

As used herein, the singular forms "a", "an", and "the" are intended to include the plural forms as well (i.e. to have the meaning "at least one"), unless expressly stated otherwise. It will be further understood that the terms "has", "includes", "comprises", "having", "including" and/or "comprising", when used in this specification, specify the presence of stated features, integers, steps, operations, elements and/or components, but do not preclude the presence or addition of one or more other features, integers, steps, operations, elements, components and/or groups thereof. It will be understood that when an element is referred to as being "connected" or "coupled" to another element, it can be directly connected or coupled to the other element, or intervening elements may be present, unless expressly stated otherwise. As used herein, the term "and/or" includes any and all combinations of one or more of the associated listed items. The steps of any method disclosed herein do not have to be performed in the exact order disclosed, unless expressly stated otherwise.

BRIEF DESCRIPTION OF THE DRAWINGS

The invention will be explained in more detail below in connection with preferred embodiments and with reference to the drawings in which.

The figures are schematic and simplified for clarity, and they just show details, which are essential to the understanding of the invention, while other details are left out. Throughout, like reference numerals and/or names are used for identical or corresponding parts.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

MODE(S) FOR CARRYING OUT THE INVENTION

Figure 1:
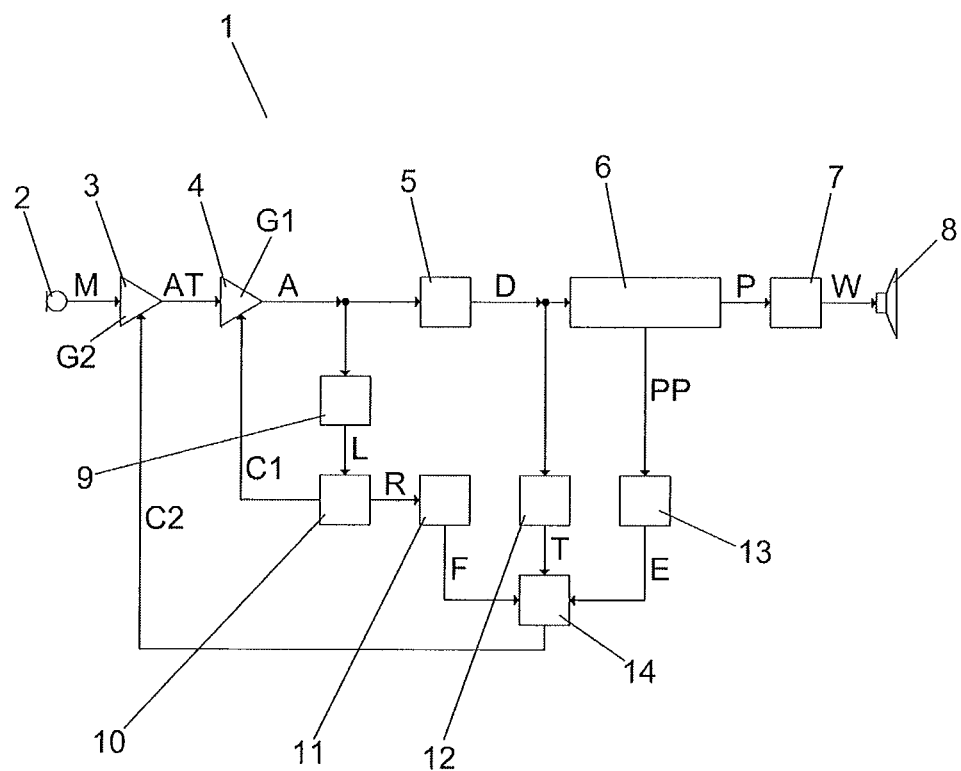
FIG. 1 shows a first embodiment of a hearing device according to the invention.

The hearing device 1 shown in FIG. 1 comprises a microphone 2, an attenuator 3 with a controllable gain G2, a preamplifier 4 with a controllable gain G1, a digitiser 5, a signal processor 6, a pulse-width modulator 7, a speaker 8, a peak-level detector 9, a fast-working gain controller 10, a counter 11, an averager 12, a sound-environment detector 13 and a slow-working gain controller 14. The microphone 2, the attenuator 3, the preamplifier 4 and the digitiser 5 together form an input path.

In the following, signal changes, attack times, hold times and release times, etc. related to the fast-working gain controller 10 are referred to as "fast", whereas such entities or properties related to the slow-working gain controller 14 are referred to as "slow".

The microphone 2 acts as an input transducer and provides an electric input signal M to the attenuator 3 in dependence on an acoustic input signal received from the hearing-device user's surroundings. The attenuator 3 attenuates the electric input signal M and provides the attenuated signal AT to the preamplifier 4, which amplifies the attenuated signal AT and provides the amplified signal A to the digitiser 5 and the peak-level detector 9. The amplifier circuits, i.e. the attenuator 3 and the preamplifier 4, together form an amplifier with a total gain G equal to the product of G1 and G2.

The gain G2 of the attenuator 3 is controlled by the slow-working gain controller 14 within a range from unity and downwards, e.g. between 0 dB and −20 dB, and the gain G1 of the preamplifier 4 is controlled by the fast-working gain controller 10 within a range above unity, e.g. between 0 dB and +30 dB. The controllable gain range of any or both of the amplifier circuits 3, 4 may alternatively reside anywhere below, across and/or above unity. Accordingly, the term "amplification" as used within this document includes any amplification with factors numerically larger than, equal to or smaller than unity. The same applies to the terms "amplify", "amplified" and "gain".

The digitiser 5 converts the amplified signal A into a digital signal D with a resolution of 16 bits, which yields a dynamic range of up to about 90 dB. The input range of the digitiser 5 is chosen such that an acoustic signal with a level of 0 dB SPL (i.e. 0 dB re 20 µPa) is just noticeable in the digital signal D when the amplifier gain G is at its maximum. Consequently, an acoustic signal with a level exceeding about 90 dB SPL would cause the digitiser 5 to clip the amplified signal A during digitising at maximum amplifier gain G. Clipping may additionally or alternatively occur in the amplifier 3, 4, but the result would be the same, namely the creation of considerable harmonic distortion in the digitised signal D. Accordingly, the term "clipping" as used herein is meant to include any actual, non-linear reduction of the signal amplitude caused by clipping, soft-clipping or transistor saturation occurring in the digitiser 5 or in any analog circuits 3, 4 preceding the digitiser 5.

The peak-level detector 9 provides a peak-level signal L indicating the instant level of the amplified signal A to the fast-working gain controller 10, which reduces the gain G1 of the preamplifier 4 by means of a corresponding fast control signal C1 whenever the peak-level signal L indicates that the amplified signal A has an instant level that would cause clipping in the digitiser 5 and/or in any analog circuits 3, 4 preceding the digitiser 5. When the instant level of the amplified signal A returns to a non-clipping level, the fast-working gain controller 10 increases the gain G1 of the preamplifier 4 back to the gain value present before the reduction. The fast temporary gain reductions thus act to reduce clipping in the input path 2, 3, 4, 5. The fast gain changes may be filtered to avoid very sudden gain changes by the fast-working gain controller 10. However, preferred time constant ranges for the fast gain reductions are: attack time 0-50 µs or 0-10 µs; and release time 0-100 ms or 0-10 ms.

The peak-level detector 9 may alternatively provide an indication of the instant signal level of an analog signal at any other point in the input path 2, 3, 4, 5, e.g. the instant signal level of the electric input signal M or of the attenuated signal AT, in which case the fast-working gain controller 10 must compensate for any gain G1, G2, G applied to that signal in the remaining portion of the input path 2, 3, 4, 5 before digitising. The peak-level detector 9 may alternatively be connected to the output of a further microphone (not shown). As an alternative to the peak-level detector 9, a comparator (not shown) may provide an indication when the instant signal level of an analog signal in the input path 2, 3, 4, 5 exceeds a predefined threshold.

The digitiser 5 provides the digitised signal D to the averager 12 and to the signal processor 6, which processes it in correspondence with the purpose of the hearing device 1. Such purpose-specific signal processing may include e.g.

amplification, attenuation, frequency filtering, level compression, level expansion, frequency shifting, noise suppression, voice detection, suppression of acoustic feedback, and/or other modifications as already well known in the art of hearing devices. Any combinations of such modifications may be made within one or more frequency ranges or bands.

The signal processor 6 provides the processed signal P to the pulse-width modulator 7, which provides a corresponding pulse-width modulated signal W to the speaker 8. The speaker 8 converts the pulse-width modulated signal W into an acoustic output signal, which it radiates into the user's ear or ear canal. The acoustic output signal is thus a processed version of the acoustic input signal.

The fast-working gain controller 10 provides a signal R indicating each fast gain reduction to the counter 11, which determines the frequency of the fast gain reductions, i.e. number of occurrences per time unit, and provides a corresponding signal F to the slow-working gain controller 14. The signal R may alternatively be provided by the peak-level detector 9 or by a further circuit (not shown) in dependence on an analog signal M, AT, A at another point in the input path 2, 3, 4, 5.

The averager 12 determines a time-averaged level of the digitised signal D and provides the time-averaged signal T to the slow-working gain controller 14. The time constant of the averager 12 is substantially larger than the duration of the fast gain reductions, e.g. about five times, ten times or fifty times the duration, or even more, such that the time-averaged signal T is highly immune to the fast gain reductions and to transient signals causing fast gain reductions. The averager 12 may alternatively provide the time averaged signal T in dependence on an analog signal M, A, AT in the input path 2, 3, 4, 5, in which case the slow-working gain controller 14 may be required to compensate for any gain G1, G2, G applied to the analog signal in the remaining portion of the input path 2, 3, 4, 5 before digitising.

The sound-environment detector 13 detects or recognises predefined sound environments on the basis of the digitised signal D, the processed signal P and/or a partly-processed signal PP from the signal processor 6 and provides a signal E indicating the detected sound environment to the slow-working gain controller 14. Such sound-environment detectors 13 are well known in the art and any of these may be used. The sound-environment detector 13 may detect different types of sound environments such as e.g. "music", "windy", "conversation", "in car", "at home", "party" etc. The detection may e.g. be made on the basis of determination of amplitude modulation, frequency content, presence of pure tone signals, ambient noise level, etc. The sound-environment detector 13 may alternatively detect the sound environments in dependence on an analog signal M, AT, A in the input path 2, 3, 4, 5.

The slow-working gain controller 14 estimates the risk of occurrence of fast gain reductions in dependence on the determined frequency of fast gain reductions, on the determined time-averaged level and/or on the detected sound environment. When the slow-working gain controller 14 determines that the risk is high, it reduces the gain G2 of the attenuator 3 by means of a corresponding slow control signal C2 in order to reduce the risk. When the risk is low, the slow-working gain controller 14 raises the gain G2. The slow-working gain controller 14 controls the gain G2 such that the duration of the slow gain reductions is substantially larger than the durations of the fast gain reductions, e.g. at least five times, at least ten times, or at least fifty times the duration of the fast gain reductions, or even more. The slow gain reductions have relative large attack and release times. Each of these is achieved by repetitively applying a relatively small gain change, e.g. 1 dB, 0.5 dB or 0.25 dB, in order to make the slow gain reductions inaudible to the user. The signal processor 6 may furthermore control the digital gain in its processing such that it compensates for the slow gain reductions. Alternatively, the slow gain reductions may have extremely short attack and/or release times, e.g. corresponding to a single sample interval, and a large hold time. In this case, the gain changes may be made inaudible by controlling the digital gain in the signal processor 6 such that it immediately compensates for the sudden analog gain changes.

Generally, each of a high frequency of fast gain reductions and a high time-averaged level indicates a high risk of further occurrences of fast gain reductions. The estimated risk may be reduced or increased depending on the detected sound environment. The detection of e.g. music in the sound environment may imply an increased risk of sudden increases in the received sound level and thus an increased risk of occurrences of fast gain reductions. Similar considerations apply to detection of wind noise and detection of the user's own voice. Any of the circuits 11, 12, 13 providing the signals F, T, E evaluated to estimate the risk may be omitted depending on the required quality of the acoustic output signal provided to the user.

The slow-working gain controller 14 may apply a hysteresis on the estimated risk and/or on any combination of the signals F, T, E evaluated to estimate the risk when determining when to terminate the slow gain reductions. This reduces the risk of gain drift, e.g. during listening to music, where such drift could be particularly annoying to the user.

The order of the amplifier circuits 3, 4 may be changed, so that the preamplifier 4 precedes the attenuator 3 in the input path 2, 3, 4, 5.

Figure 2:
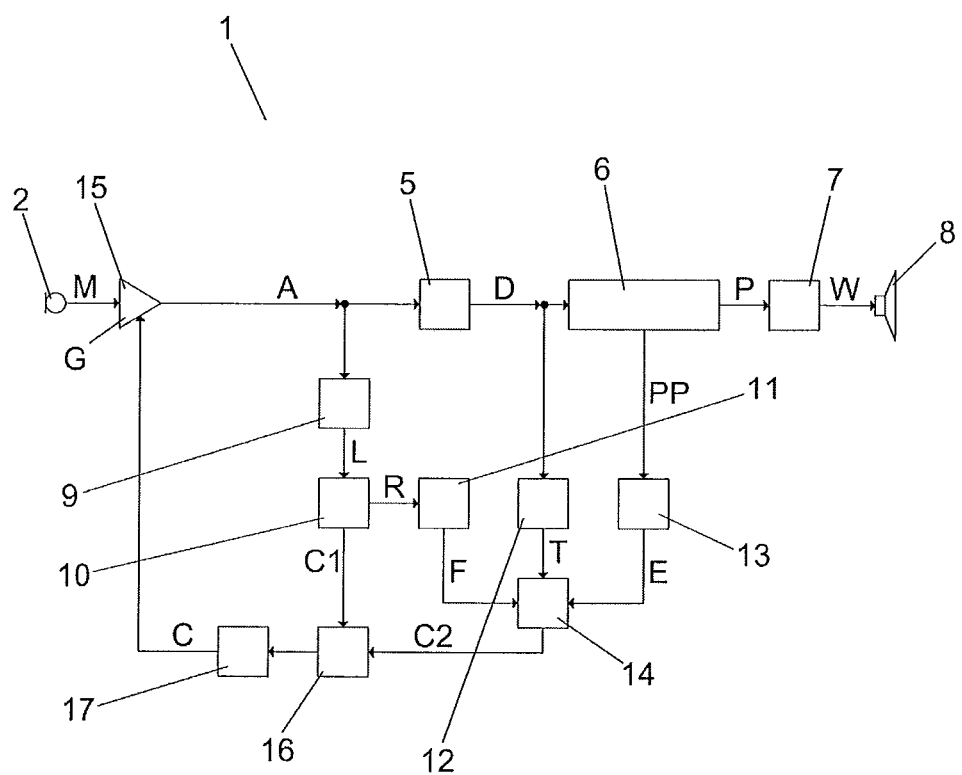
FIG. 2 shows a second embodiment of a hearing device according to the invention.

The hearing device 1 shown in FIG. 2 is identical to the hearing device 1 shown in FIG. 1, except that the attenuator 3 and the preamplifier 4 have been replaced with a single amplifier 15 and that an adder 16 and a limiter 17 have been introduced. The adder 16 adds the fast control signal C1 and the slow control signal C2 into a common control signal C, which is provided to the amplifier 15 to set its gain G. The limiter 17 limits the common control signal C such that the gain G of the amplifier 15 stays within a predefined gain range. The adder 16 may be replaced with any other combiner, depending on the nature of the fast and slow control signals C1, C2. The limiter 17 may be omitted depending on the size of the fast and slow gain reductions.

Figure 3:
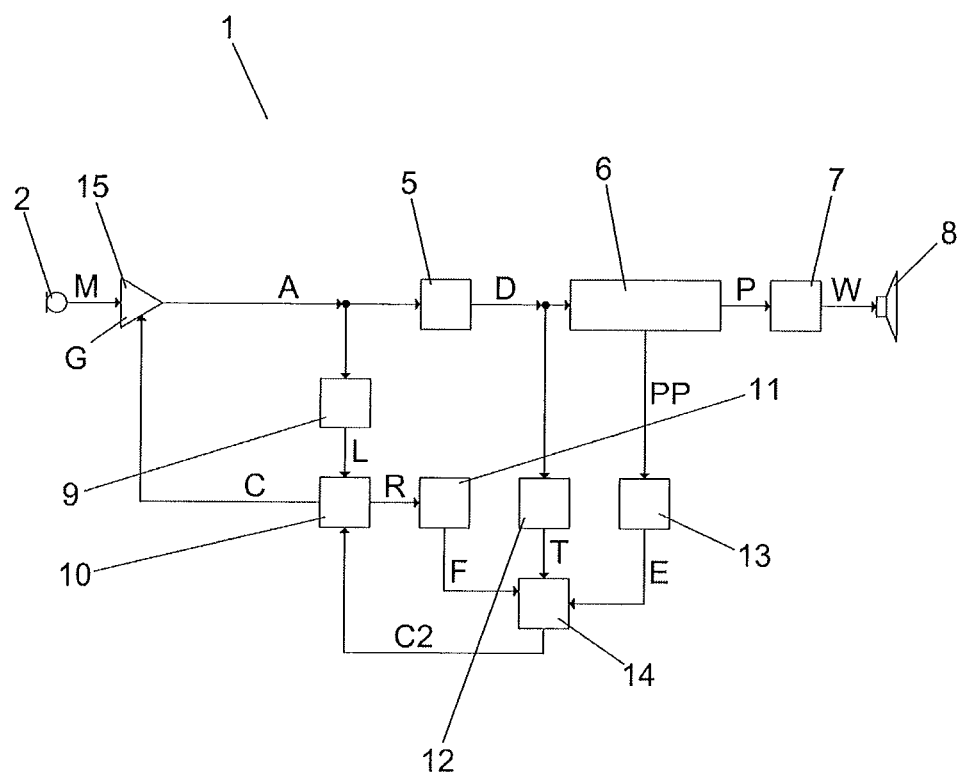
FIG. 3 shows a third embodiment of a hearing device according to the invention.

The hearing device 1 shown in FIG. 3 is identical to the hearing device 1 shown in FIG. 2, except that the adder 16 and the limiter 17 have been removed. Instead, the slow-working gain controller 14 provides the slow gain control signal C2 to the fast-working gain controller 10, which incorporates the control information for both fast and slow gain reductions into the common control signal C provided to the amplifier 15. The fast-working gain controller 10 also limits the common control signal C corresponding to the limiting applied by the limiter 17 if required.

Any combination of the peak-level detector 9, the fast-working gain controller 10, the counter 11, the averager 12, the sound-environment detector 13, the slow-working gain controller 14, or parts hereof, may be implemented as part of the signal processor 6. As a further alternative, the signal processor 6 may comprise mainly a microcontroller, which controls a digital filter to obtain the desired device processing.

The pulse-width modulator 7 may be replaced with any converter suitable for providing an analog signal W to the speaker 8 in dependence on the digital processed signal P. The speaker 8—and optionally the pulse-width modulator 7—may be replaced with other output transducers suitable for providing an audible signal to the user as described further above.

The hearing device 1 may comprise two or more input paths 2, 3, 4, 5, 15, e.g. in order to allow directional filtering of the acoustic input signal by combining the output signals A, D of the respective input paths 2, 3, 4, 5, 15. The output signals A, D of the input paths may be combined in analog circuits (not shown) prior to digitising in a common digitiser 5 or in the signal processor 6 after individual digitising. In both cases, the gains G1, G2, G of the respective amplifiers 3, 4, 15 are preferably controlled to be equal, i.e. synchronised, across all input paths 2, 3, 4, 5, 15 in order to avoid direction shifts in the combined signal. Alternatively, only the slow gain reductions are synchronised across all input paths 2, 3, 4, 5, 15. Preferably, the fast-working gain controller 10 and the slow-working gain controller 14 control respectively the fast and slow gain reductions synchronously in all input paths 2, 3, 4, 5, in dependence on signals from one or more of the input paths 2, 3, 4, 5, 15.

The time constants, i.e. the fast and slow attack, hold and release times, may be programmable during a fitting procedure in which the processing of the hearing device 1 is adapted to the needs or requirements of the user. Such fitting procedures are well known for hearing aids. The time constants may further or alternatively be dependent on a detected environment and/or of user-controlled settings.

Digital—or partly digital—functional blocks 3, 4, 5, 6, 7, 9, 10, 11, 12, 13, 14, 15, 16, 17 of the hearing device 1 may be implemented in any suitable combination of hardware, firmware and software and/or in any suitable combination of hardware units. Furthermore, any single hardware unit may execute the operations of several functional blocks in parallel or in interleaved sequence and/or in any suitable combination thereof.

The hearing device 1 may be part of a hearing system or a binaural hearing system with two hearing devices 1 as described above. In this case, the slow gain reductions may be synchronised across all input paths 2, 3, 4, 5, 15 comprised in the two hearing devices 1. The synchronisation may take place by means of synchronisation data transmitted via a wired or wireless communication means (not shown) connecting the hearing devices 1. For example, one of the hearing devices 1 may transmit synchronisation data indicating the current slow gain G2, G to the other hearing device 1, which uses the received data to set its slow gain G2, G correspondingly. Suitable communication means are already well known in the art. Depending on the transmission speed of the communication means, also the fast gain reductions may be synchronised in a similar way across all input paths 2, 3, 4, 5, 15 comprised in the two hearing devices 1.

Further modifications obvious to the skilled person may be made to the disclosed method, system and/or device without deviating from the spirit and scope of the invention. Within this description, any such modifications are mentioned in a non-limiting way.

Some preferred embodiments have been described in the foregoing, but it should be stressed that the invention is not limited to these, but may be embodied in other ways within the subject-matter defined in the following claims. For example, the features of the described embodiments may be combined arbitrarily, e.g. in order to adapt the system, the devices and/or the method according to the invention to specific requirements.

It is further intended that the structural features of the system and/or devices described above, in the detailed description of 'mode(s) for carrying out the invention' and in the claims can be combined with the methods, when appropriately substituted by a corresponding process. Embodiments of the methods have the same advantages as the corresponding systems and/or devices.

Any reference numerals and names in the claims are intended to be non-limiting for their scope.

The invention claimed is:

1. A hearing device comprising an input transducer arranged to receive an acoustic signal from an individual's surroundings and adapted to provide a corresponding electric input signal, an amplifier adapted to amplify the electric input signal, a first gain controller adapted to control a gain of the amplifier in dependence on the electric input signal, a digitizer adapted to digitize the amplified signal, a signal processor adapted to process the digitized signal and an output transducer adapted to provide an audible signal to the individual in dependence on the processed signal, the input transducer, the amplifier and the digitizer forming a first input path, the first gain controller being adapted to reduce clipping by providing temporary first gain reductions of the amplifier gain with a first duration, characterized in that the hearing device further comprises a second gain controller adapted to reduce occurrences of the first gain reductions by providing temporary second gain reductions of the amplifier gain with a second duration substantially larger than the first duration.

2. A hearing device according to claim 1, wherein the hearing device further comprises a peak-level detector adapted to determine a peak level of a signal in the first input path and the first gain controller is further adapted to provide the first gain reductions in dependence on the determined peak level.

3. A hearing device according to claim 1 or 2, wherein the hearing device further comprises an averager adapted to determine a time-averaged level of a signal in the first input path or of the digitised signal and the second gain controller is further adapted to provide the second gain reductions in dependence on the determined time-averaged level.

4. A hearing device according to claim 1, wherein the hearing device further comprises a counter adapted to determine a frequency of the first gain reductions and the second gain controller is further adapted to provide the second gain reductions in dependence on the determined frequency.

5. A hearing device according to claim 1, wherein the hearing device further comprises a sound-environment detector adapted to detect a sound environment in dependence on the electric input signal and the second gain controller is further adapted to provide the second gain reductions in dependence on the detected sound environment.

6. A hearing device according to claim 1, wherein the amplifier comprises a first amplifier circuit and a second amplifier circuit, the first gain controller is further adapted to provide the first gain reductions by reducing a gain of the second amplifier circuit and the second gain controller is further adapted to provide the second gain reductions by reducing a gain of the first amplifier circuit.

7. A hearing device according to claim 1, wherein the first gain controller is further adapted to provide a first control signal for controlling the first gain reductions, the second gain controller is further adapted to provide a second control signal for controlling the second gain reductions, the hearing device further comprises a combiner adapted to combine the first and the second control signals into a third control signal and the amplifier is further adapted to set its gain in dependence on the third control signal.

8. A hearing device according to claim 7, wherein the hearing device further comprises a limiter adapted to limit the third control signal.

9. A hearing device according to claim 1, wherein the second gain controller is further adapted to provide a first control signal for controlling the second gain reductions to the first gain controller, the first gain controller is further adapted to provide a second control signal for controlling the first and the second gain reductions and the amplifier is further adapted to set its gain in dependence on the second control signal.

10. A hearing device according to claim 1, wherein the second gain controller applies a hysteresis when determining when to terminate the second gain reductions.

11. A hearing device according to claim 1, wherein the hearing device further comprises a second input path and wherein at least one of the first and second gain controllers is further adapted to provide temporary reductions of the amplifier gain in the second input path in synchronization with at least one of the temporary first and second gain reductions of the amplifier gain in the first input path.

12. A hearing device according to claim 1, wherein the hearing device is adapted to receive data from a further hearing device via a wired or wireless communication means, and wherein the hearing device is adapted to use the received data to provide at least one of the temporary first and second gain reductions of the amplifier gain in synchronization with corresponding reductions of the amplifier gain in one or more input paths in the further hearing device.

13. A hearing device according to claim 1, wherein:
the first gain reductions have an attack time between 0 μs and 50 μs or between 0 μs and 10 μs,
the first gain reductions have a release time between 0 ms and 100 ms or between 0 ms and 10 ms, and
the duration of the second gain reductions is at least five times, at least ten times, or at least fifty times the duration of first gain reductions.

14. A method for operating a hearing device, the method comprising:
receiving an acoustic signal from an individual's surroundings and providing a corresponding electric input signal;
amplifying the electric input signal in an amplifier;
controlling a gain of the amplifier in dependence on the electric input signal;
digitizing the amplified signal;
processing the digitized signal;
providing an audible signal to the individual in dependence on the processed signal; and
reducing clipping by providing first temporary reductions of the amplifier gain with a first duration, characterized in further comprising:
reducing occurrences of the first temporary gain reductions by providing second temporary reductions of the amplifier gain with a second duration substantially larger than the first duration.

15. A method according to claim 14 and further comprising:
receiving data from a further hearing device via a wired or wireless communication means; and
using the received data to provide at least one of the first and second temporary reductions of the amplifier gain in synchronization with corresponding reductions of the amplifier gain in one or more input paths in the further hearing device.

* * * * *